(12) United States Patent
Seto et al.

(10) Patent No.: US 7,473,628 B2
(45) Date of Patent: Jan. 6, 2009

(54) METHOD OF MANUFACTURING SEMICONDUCTOR DEVICE AND SEMICONDUCTOR DEVICE

(75) Inventors: Masaharu Seto, Yokohama (JP); Hirokazu Ezawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 281 days.

(21) Appl. No.: 11/358,137

(22) Filed: Feb. 22, 2006

(65) Prior Publication Data
US 2006/0189114 A1    Aug. 24, 2006

(30) Foreign Application Priority Data
Feb. 23, 2005    (JP)    ............... P2005-047679

(51) Int. Cl.
H01L 21/44    (2006.01)
H01L 23/48    (2006.01)
H01L 23/52    (2006.01)
H01L 29/40    (2006.01)

(52) U.S. Cl. ...................... 438/613; 438/597

(58) Field of Classification Search ............... None
See application file for complete search history.

(56) References Cited

U.S. PATENT DOCUMENTS

| 6,569,752 | B1 | 5/2003 | Homma et al. |
| 2005/0042872 | A1 | 2/2005 | Chien et al. |
| 2005/0242446 | A1* | 11/2005 | Jin ............... 257/779 |
| 2008/0054459 | A1* | 3/2008 | Lee et al. ............... 257/737 |

* cited by examiner

*Primary Examiner*—Zandra Smith
*Assistant Examiner*—Pamela E Perkins
(74) *Attorney, Agent, or Firm*—Finnegan, Henderson, Farabow, Garrett & Dunner, L.L.P.

(57) ABSTRACT

According to an embodiment of the present invention, a method of manufacturing a semiconductor device, comprising forming a conducting layer on a substrate; forming a resist mask having an opening in a prescribed position on the conducting layer; forming a first plated film in the opening by supplying an electric current to the conducting layer; increasing the interval between an inner side surface of the resist mask forming the opening and the first plated film by setting back the inner side surface; and forming a second plated film in the opening resulting from the setback of the inner side surface to cover the first plated film by supplying an electric current to the conducting layer.

11 Claims, 6 Drawing Sheets

METHOD OF MANUFACTURING SEMICONDUCTOR DEVICE AND SEMICONDUCTOR DEVICE

CROSS-REFERENCE TO RELATED APPLICATIONS

This application is based upon and claims the benefit of priority from the prior Japanese Patent Application No. 2005-047679, filed on Feb. 23, 2005; the entire contents of which are incorporated herein by reference.

BACKGROUND OF THE INVENTION

1. Field of the Invention

The present invention relates to a method of manufacturing a semiconductor device and a semiconductor device.

2. Description of the Related Art

There is a conventionally known technology that conducts flip-chip connection of a semiconductor chip and an interposer substrate such as a BGA substrate with solder bumps which are formed on the semiconductor chip.

The solder bumps are formed of Pb based solder such as Sn—Pb but now being formed of Pb-free solder such as Sn—Ag in view of an influence of lead on the environments in these years.

Where Sn—Ag solder is used to form the solder bumps, a plating method is used. For example, the solder bumps are formed by forming a conducting layer on a passivation film, supplying the conducting layer with an electric current, supplying a binary plating solution of Sn and Ag to form the Sn—Ag solder on the conducting layer, and then reflowing the Sn—Ag solder.

But, it is hard to accurately control the composition of the Sn—Ag solder because it is difficult to control the binary plating solution. Therefore, a technology that forms to stack an Ag film and an Sn film with a unitary plating solution and reflows to form Sn—Ag solder bumps is being watched with interest.

But, according to the above technology, the side surface of the Ag film is possibly etched with a chemical solution or the like and damaged when the conducting layer is removed after the Ag film and the Sn film are formed. As a result, the solder bumps do not have a desired composition, and there is a possibility that a melting point is varied and mechanical strength is degraded.

BRIEF SUMMARY OF THE INVENTION

According to an aspect of the present invention, there is provided a method of manufacturing a semiconductor device, comprising forming a conducting layer on a substrate; forming a resist mask having an opening in a prescribed position on the conducting layer; forming a first plated film in the opening by supplying an electric current to the conducting layer; increasing the interval between an inner side surface of the resist mask forming the opening and the first plated film by setting back the inner side surface; and forming a second plated film in the opening resulting from the setback of the inner side surface to cover the first plated film by supplying an electric current to the conducting layer.

According to another aspect of the present invention, there is provided a semiconductor device, comprising a substrate; a conducting layer which is formed on the substrate; a first plated film which is formed on the conducting layer; and a second plated film which is formed on the conducting layer to cover the top and side surfaces of the first plated film.

DETAILED DESCRIPTION OF THE INVENTION

FIRST EMBODIMENT

A first embodiment will be described. FIG. 1A through FIG. 1H are schematic views showing a method of manufacturing a semiconductor device according to this embodiment.

Figure 1A:
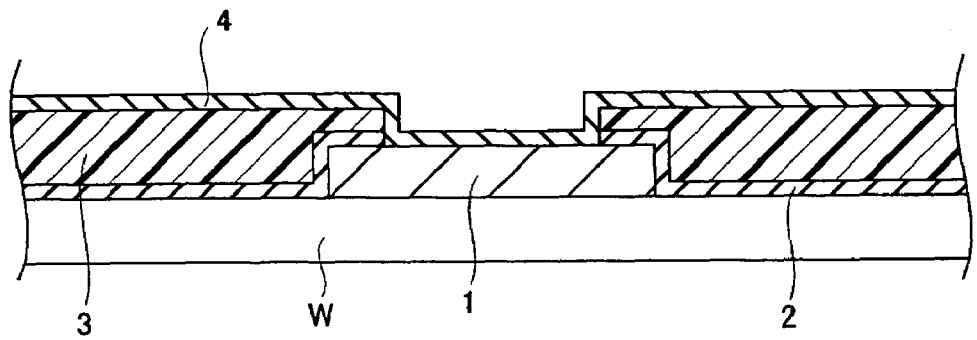
FIG. 1A through FIG. 1H are schematic views showing a method of manufacturing a semiconductor device according to a first embodiment.

First, a semiconductor wafer (substrate) used in this embodiment will be described. As shown in FIG. 1A, an electrode pad 1 and a passivation film 2 are formed on a semiconductor wafer W (hereinafter simply referred to as "wafer") on which semiconductor elements such as transistors (not shown) are formed. Examples of the material forming the electrode pad 1 include Al, and examples of the material forming the passivation film 2 include SiN. In this embodiment, an example in which the electrode pad 1 is formed of Al and the passivation film 2 is formed of SiN will be described.

The passivation film 2 is also formed on the electrode pad 1, and a polyimide film 3 is formed on the passivation film 2. The formation of the polyimide film 3 on the passivation film 2 can ease a stress when solder bumps 8 described later are formed and can improve adhesiveness with an underfill agent to be filled between a semiconductor chip and an interposer substrate. In this embodiment, the polyimide film 3 is formed on the passivation film 2, but the polyimide film 3 may not be formed.

The wafer W on which the electrode pad 1 and the like are formed is used to perform the following process. First, as shown in FIG. 1A, a conducting layer 4 for supplying an electric current at the time of plating is formed on the polyimide film 3. Here, the passivation film 2 and the polyimide film 3 have an opening which is positioned above the electrode pad 1, so that the conducting layer 4 comes into contact with the electrode pad 1. Examples of the material forming the conducting layer 4 include Ti based materials such as Ti, TiW and the like. In this embodiment, an example in which the conducting layer is formed of the Ti based material will be described. The conducting layer may have a multilayer structure.

Figure 1B:
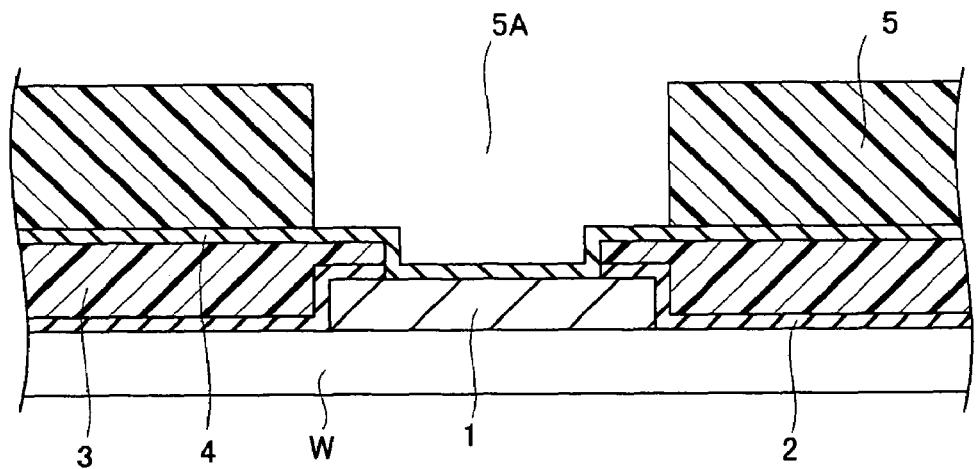

After the conducting layer 4 is formed on the polyimide film 3, a resist mask 5 having an opening 5A in a prescribed position is formed on the conducting layer 4 as shown in FIG. 1B. In this embodiment, the opening 5A is formed to locate on the electrode pad 1.

Figure 1C:
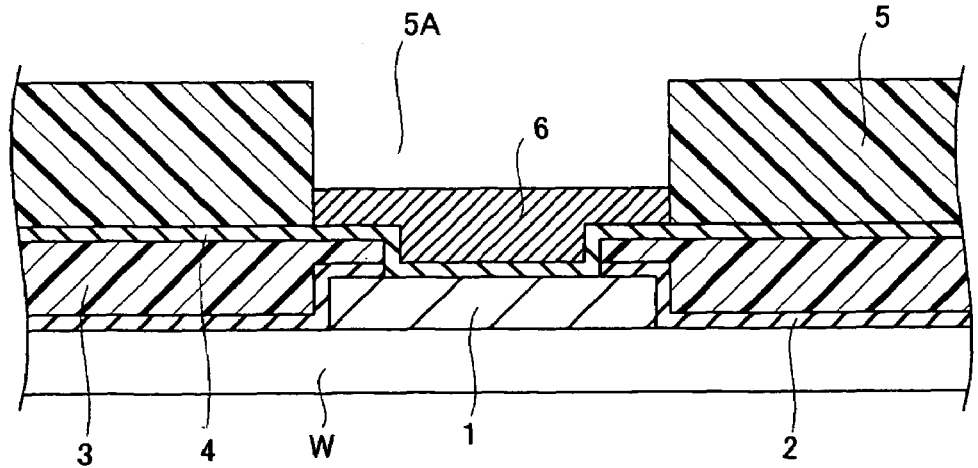

After the resist mask 5 is formed on the conducting layer 4, an electric current is supplied to the conducting layer 4 and a plating solution is also supplied to the opening 5A, and a plated film 6 (first plated film) is formed in the opening 5A as shown in FIG. 1C by a plating method. Examples of the material forming the plated film 6 include metals such as Cu, Ag, Au and the like. In this embodiment, an example in which the plated film 6 is formed of Ag will be described.

Figure 1D:
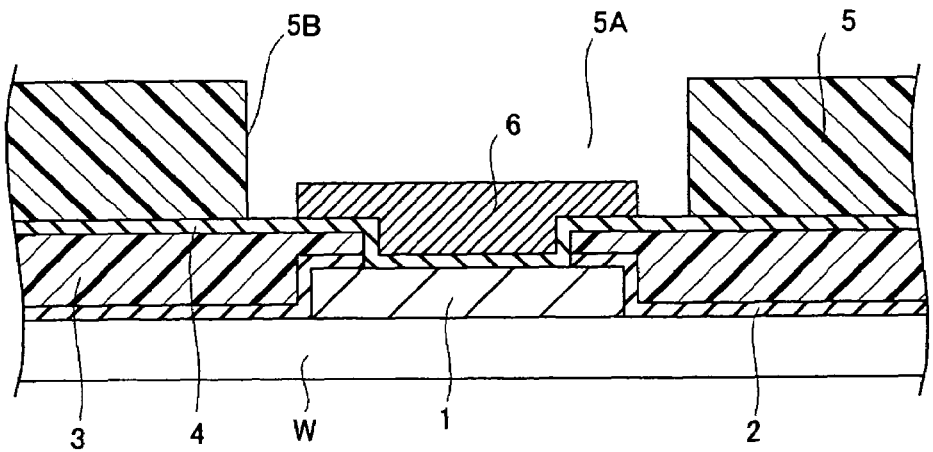

After the plated film 6 is formed in the opening 5A, the inner side surface 5B of the resist mask 5 forming the opening 5A is set back to a prescribed quantity by, for example, wet etching or dry etching to increase the interval between the inner side surface 5B and the plated film 6 as shown in FIG. 1D. Examples of the wet etching include etching which is conducted using, for example, a developing solution, a resist peeling solution or the like, and examples of the dry etching include ashing using, for example, $O_2$ or the like.

Figure 1E:
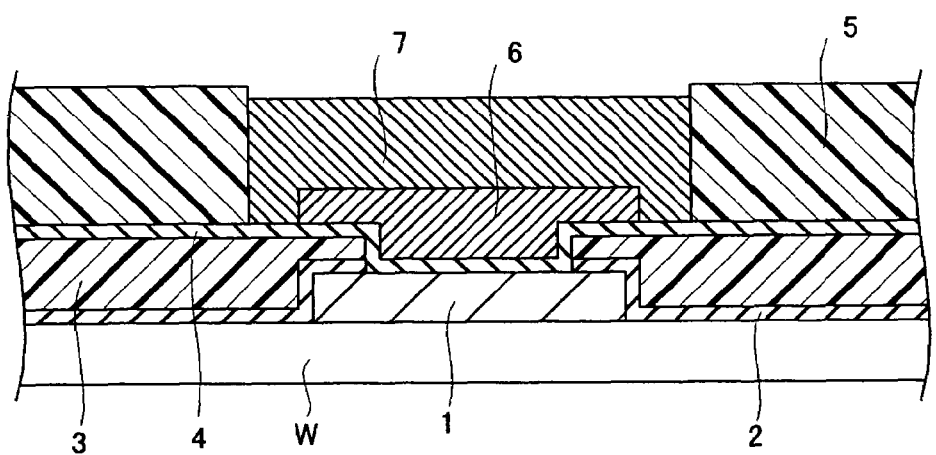

After the interval between the inner side surface 5B and the plated film 6 is increased, an electric current is supplied to the conducting layer 4 and a plating solution is also supplied into the opening 5A to form a plated film 7 (second plated film) in the opening 5A to cover the plated film 6 as shown in FIG. 1E by the plating method. Examples of the material forming the plated film 7 include metals which are different from the metal forming the plated film 6. In this embodiment, an example in which the plated film 7 is formed of Sn will be described.

Figure 1F:
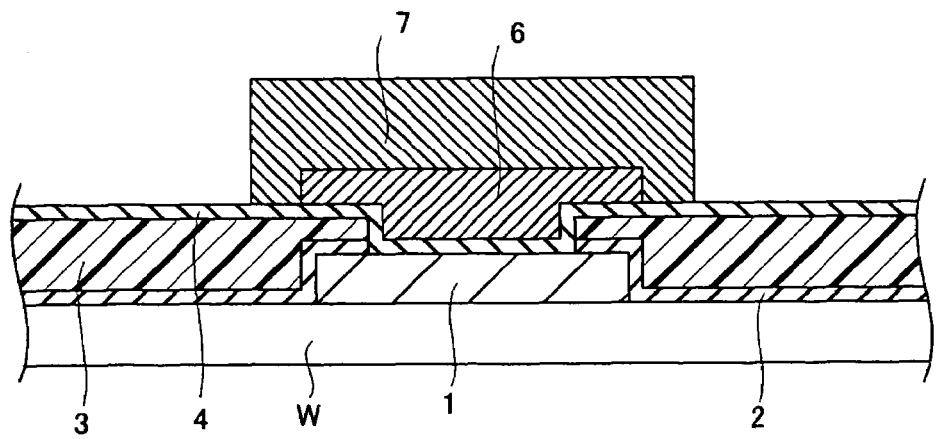
Figure 1G:
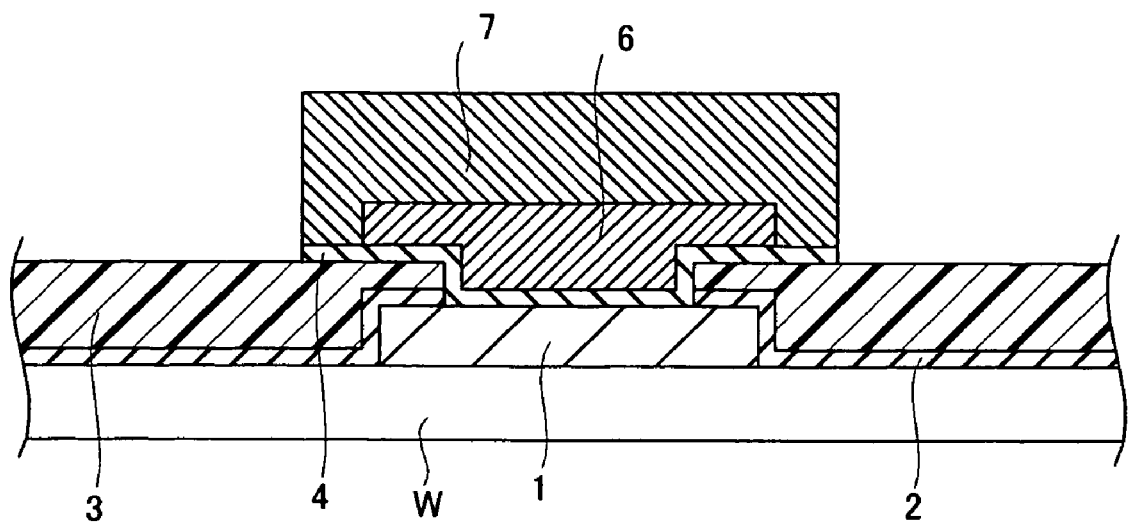

After the plated film 7 is formed, the resist mask 5 is removed with a chemical solution such as a resist peeling solution as shown in FIG. 1F. Then, portions of the conducting layer 4 not covered with the plated films 6, 7 are removed as shown in FIG. 1G. In this embodiment, the conducting layer 4 is formed of a Ti based material, so that the conducting layer 4 can be removed by using a dilute hydrofluoric acid or the like. Here, the portions of the conducting layer 4 covered with the plated films 6, 7 serve as the barrier metal to suppress Sn forming the plated films 7 and contained in the solder bumps 8 to be described later from diffusing.

Figure 1H:
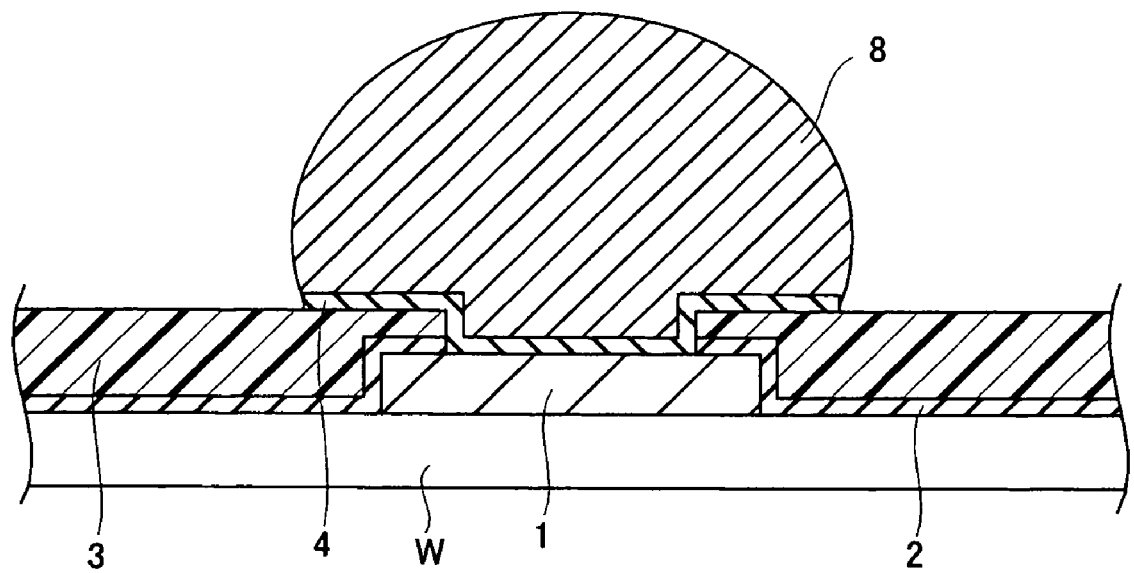

After the conducting layer 4 is removed, the plated films 6, 7 are reflown to form solder bumps 8 as shown in FIG. 1H. In this embodiment, the plated film 6 is formed of Ag, and the plated film 7 is formed of Sn, so that the solder bumps 8 are formed of Sn—Ag.

Then, it is not shown in the drawing but the wafer W on which the solder bumps 8 are formed is diced to form semiconductor chips, and the solder bumps 8 are used to conduct flip-chip mounting on an interposer substrate such as a BGA substrate. Lastly, an underfill agent is filled between the semiconductor chips and the interposer substrate, and the semiconductor chips are also sealed with a sealing resin to obtain semiconductor devices.

In this embodiment, after the plated film 6 is formed, the inner side surface 5B of the resist mask 5 is set back to increase the interval between the inner side surface 5B and the plated film 6, so that when the plated film 7 is formed, the top and side surfaces of the plated film 6 are covered with the plated film 7. Thus, the plated film 6 can be prevented from being damaged when the conducting layer 4 is removed. As a result, the solder bumps 8 having a desired composition can be obtained, and a change in melting point and a decrease in mechanical strength can be suppressed. In this embodiment, the plated film 7 is formed of Sn, so that the plated film 7 is not etched substantially even if the conducting layer 4 is removed with a dilute hydrofluoric acid.

SECOND EMBODIMENT

A second embodiment will be described below. Descriptions overlapping with those of the first embodiment might be omitted. In this embodiment, an example of forming relocation wiring of a wafer level CSP (Chip Scale Package) by the method described in the first embodiment will be described. FIG. 2A through FIG. 2I are schematic views showing a method of manufacturing a semiconductor device according to this embodiment.

Figure 2A:
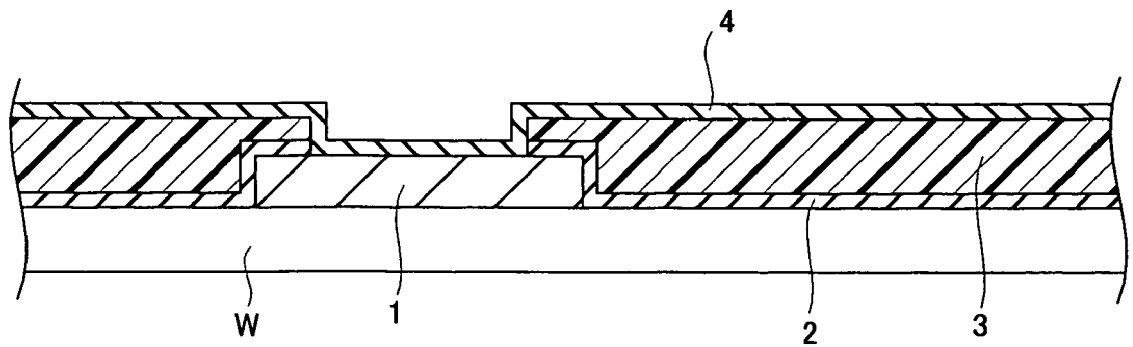
FIG. 2A through FIG. 2I are schematic views showing a method of manufacturing a semiconductor device according to a second embodiment.

As shown in FIG. 2A, the conducting layer 4 is formed on the polyimide film 3. In this embodiment, an example in which the conducting layer 4 is also formed of a Ti based material will be described.

Figure 2B:
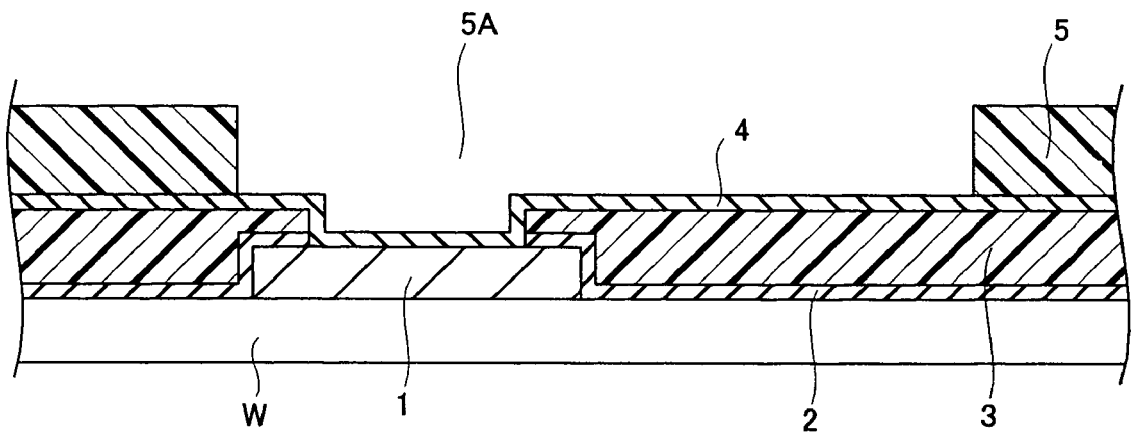

After the conducting layer 4 is formed on the polyimide film 3, the resist mask 5 having the opening 5A in a prescribed position is formed on the conducting layer 4 as shown in FIG. 2B. In this embodiment, the opening 5A is formed to locate on a position where the relocation wiring is formed.

Figure 2C:
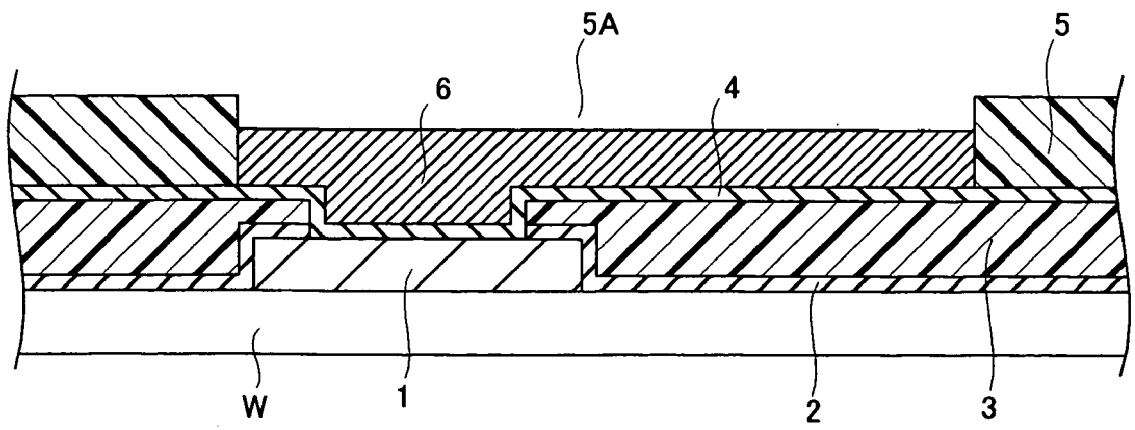

After the resist mask 5 is formed on the conducting layer 4, an electric current is supplied to the conducting layer 4 and a plating solution is supplied into the opening 5A to form the plated film 6 in the opening 5A as shown in FIG. 2C by the plating method. In this embodiment, an example in which the plated film 6 is formed of Cu will be described.

Figure 2D:
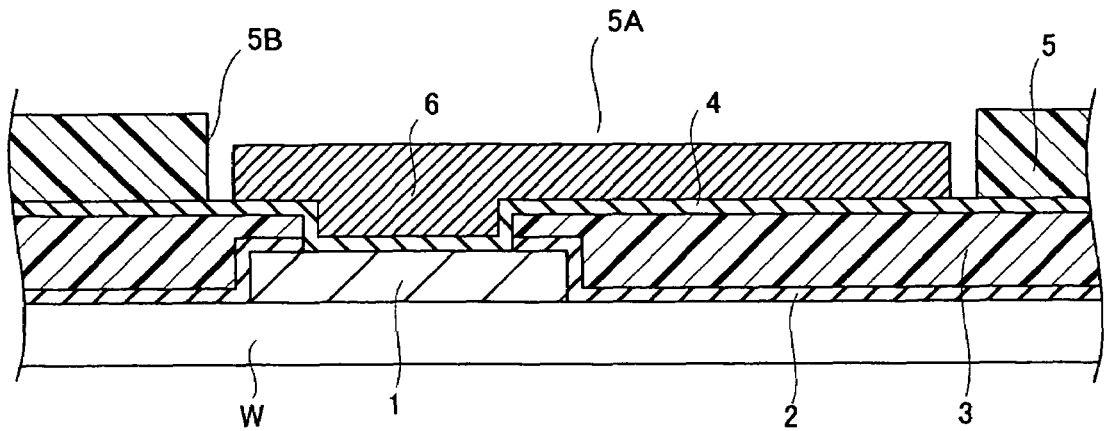

After the plated film 6 is formed in the opening 5A, the inner side surface 5B of the resist mask 5 forming the opening 5A is set back to a prescribed quantity by wet etching or dry etching to increase the interval between the inner side surface 5B and the plated film 6 as shown in FIG. 2D.

Figure 2E:
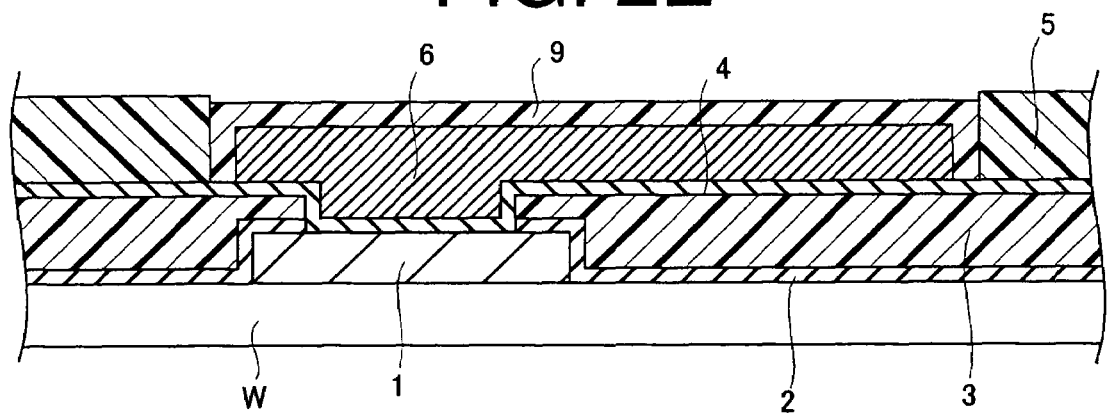

After the interval between the inner side surface 5B and the plated film 6 is increased, an electric current is supplied to the conducting layer 4 and a plating solution is supplied into the opening 5A to form a plated film 9 (second plated film) to cover the plated film 6 as shown in FIG. 2E by the plating method. Examples of the material forming the plated film 9 include an insulating material such as polyimide. In this embodiment, an example in which the plated film 9 is formed of polyimide will be described.

Figure 2F:
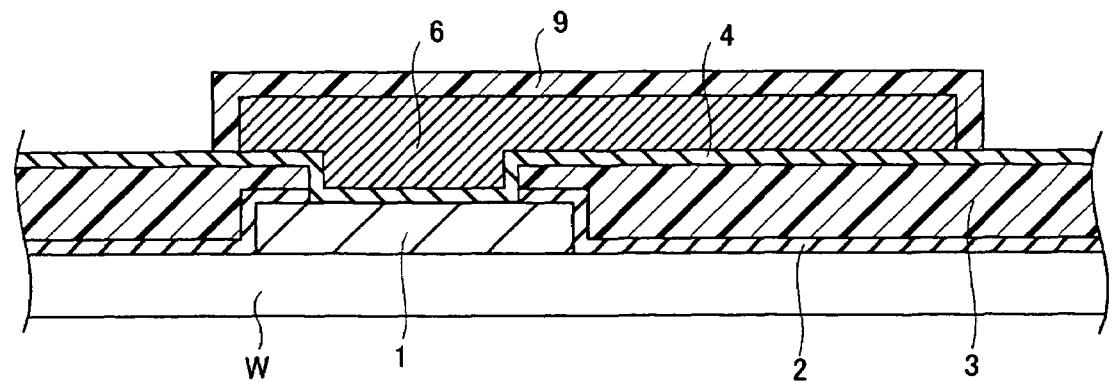
Figure 2G:
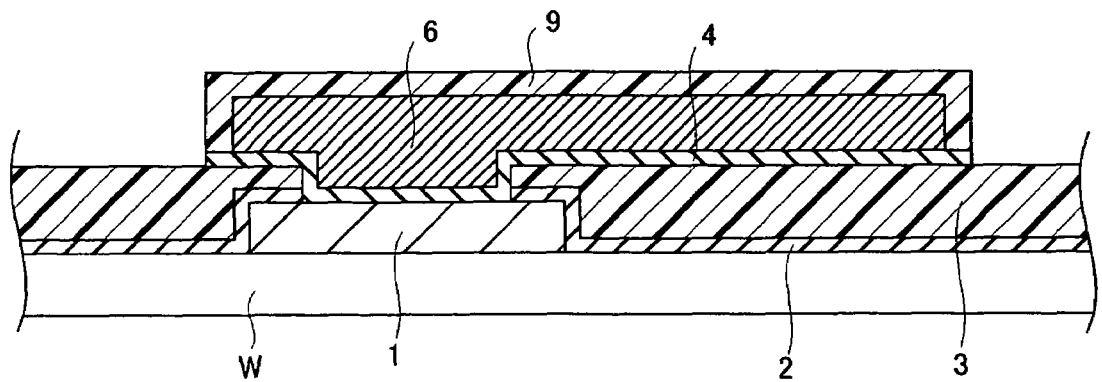

After the plated film 9 is formed, the resist mask 5 is removed with a chemical solution such as a resist peeling solution as shown in FIG. 2F. Then, portions of the conducting layer 4 not covered with the plated films 6, 9 are removed as shown in FIG. 2G. Here, the portions of the conducting layer 4 covered with the plated films 6, 9 serve as a barrier metal for suppressing Cu, which configures the plated film 6, from diffusing.

Figure 2H:
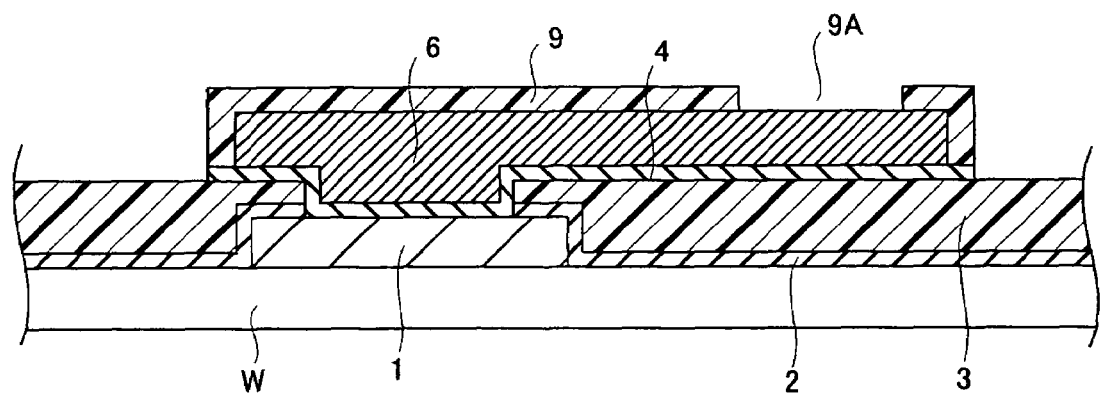
Figure 2I:
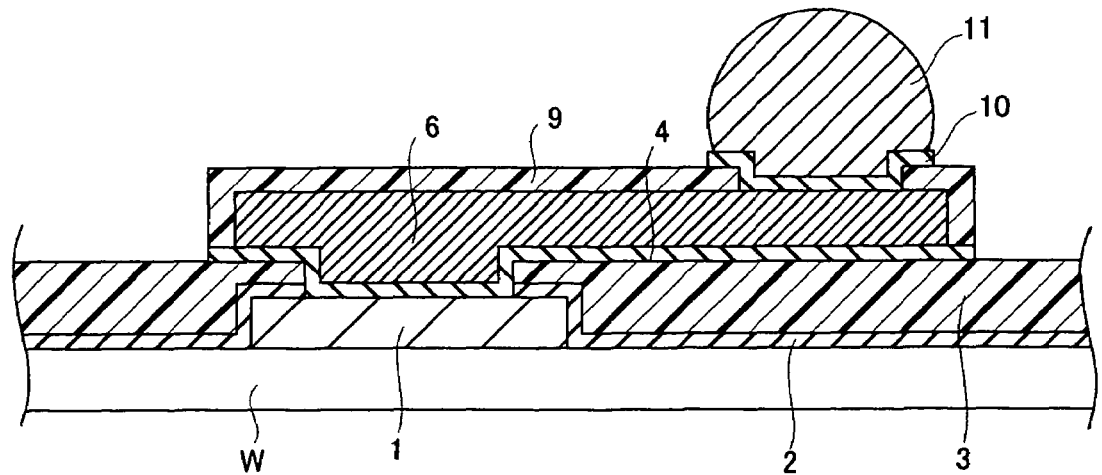

After the conducting layer 4 is removed, an opening 9A is formed in the plated film 9 as shown in FIG. 2H. Then, a barrier metal 10 is formed in the opening 9A as shown in FIG. 2I, and solder bumps 11, which are electrically connected to the plated film 6 via the opening 9A and the barrier metal 10, are formed on the barrier metal 10. In this embodiment, the solder bumps 11 are not formed by the method described in the first embodiment but may be formed by the method described in the first embodiment.

Then, it is not shown in the drawing but the wafer W on which the solder bumps 8 are formed is diced to form semiconductor chips. Thus, a semiconductor device is obtained.

In this embodiment, after the plated film 6 is formed, the inner side surface 5B of the resist mask 5 is set back to increase the interval between the inner side surface 5B and the plated film 6. Therefore, when the plated film 9 is formed, the top and side surfaces of the plated film 6 are covered with the plated film 9. Thus, the plated film 6 can be prevented from being damaged when the conducting layer 4 is removed. As a result, the plated film 6 which serves as relocation wiring can be suppressed from breaking or short-circuiting. In this embodiment, the plated film 9 is formed of polyimide, so that the plated film 9 is not etched substantially even if the conducting layer 4 is removed with a dilute hydrofluoric acid.

It is to be noted that the present invention is not limited to the described embodiments and the structure, material, arrangement of individual members and the like may be changed and modified appropriately without departing from the scope of the present invention.

What is claimed is:

1. A method of manufacturing a semiconductor device, comprising:

forming a conducting layer on a substrate;

forming a resist mask having an opening in a prescribed position on the conducting layer;

forming a first plated film in the opening by supplying an electric current to the conducting layer;

increasing the interval between an inner side surface of the resist mask forming the opening and the first plated film by setting back the inner side surface with wet etching or dry etching; and forming a second plated film in the opening resulting from the setback of the inner side surface to cover the first plated film by supplying an electric current to the conducting layer.

2. The method of manufacturing a semiconductor device according to claim 1, further comprising after the formation of the second plated film:

removing the resist mask; and removing a portion of the conducting layer not covered with the first plated film and the second plated film.

3. The method of manufacturing a semiconductor device according to claim 2, further comprising after the removal of the conducting layer:

forming a solder bump by reflowing the first plated film and the second plated film.

4. The method of manufacturing a semiconductor device according to claim 1, further comprising after the formation of the second plated film:

forming an opening in the second plated film; and forming a solder bump which is electrically connected to the first plated film via the opening formed in the second plated film.

5. The method of manufacturing a semiconductor device according to claim 1, wherein the substrate comprises an electrode pad, and the conducting layer is formed in contact with the electrode pad.

6. The method of manufacturing a semiconductor device according to claim 5, wherein the opening in the resist mask is positioned on the electrode pad.

7. The method of manufacturing a semiconductor device according to claim 1, wherein the first plated film serves as relocation wiring.

8. The method of manufacturing a semiconductor device according to claim 1, wherein the first plated film is formed of any of Cu, Ag and Au.

9. The method of manufacturing a semiconductor device according to claim 1, wherein the second plated film is formed of either Sn or polyimide.

10. The method of manufacturing a semiconductor device according to claim 1, wherein the first plated film is formed of Ag, and the second plated film is formed of Sn.

11. The method of manufacturing a semiconductor device according to claim 1, wherein the conducting layer has a function to suppress a material forming the first plated film or the second plated film from diffusing.

* * * * *